United States Patent
Fang et al.

(10) Patent No.: US 7,113,439 B2
(45) Date of Patent: Sep. 26, 2006

(54) REFRESH METHODS FOR RAM CELLS FEATURING HIGH SPEED ACCESS

(75) Inventors: Hong-Gee Fang, Hsinchu (TW);
Wen-Chieh Lee, Hsinchu (TW);
Wei-Chieh Wu, Hsinchu (TW);
Ching-Wen Chen, Hsinchu (TW)

(73) Assignee: MemoCom Corp., Hsinchu (TW)

( * ) Notice: Subject to any disclaimer, the term of this patent is extended or adjusted under 35 U.S.C. 154(b) by 161 days.

(21) Appl. No.: 10/829,207

(22) Filed: Apr. 22, 2004

(65) Prior Publication Data

US 2005/0237836 A1     Oct. 27, 2005

(51) Int. Cl.
*G11C 7/00* (2006.01)
(52) U.S. Cl. ...................... 365/222; 365/236
(58) Field of Classification Search ............... 365/222, 365/230.03, 230.06, 236
See application file for complete search history.

(56) References Cited

U.S. PATENT DOCUMENTS

| | | | |
|---|---|---|---|
| 4,549,284 A | 10/1985 | Ikuzaki ...................... 365/222 |
| 4,716,551 A * | 12/1987 | Inagaki ...................... 365/222 |
| 6,028,804 A | 2/2000 | Leung ........................ 365/222 |
| 6,356,484 B1 * | 3/2002 | Dosaka et al. .......... 365/189.01 |
| 6,449,204 B1 * | 9/2002 | Arimoto et al. ............ 365/201 |
| 6,529,426 B1 * | 3/2003 | Merritt et al. .............. 365/222 |
| 6,625,077 B1 | 9/2003 | Chen ......................... 365/222 |
| 6,850,449 B1 * | 2/2005 | Takahashi ................... 365/222 |
| 2005/0141314 A1 * | 6/2005 | Ito et al. ..................... 365/222 |

* cited by examiner

*Primary Examiner*—Gene Auduong
(74) *Attorney, Agent, or Firm*—Finnegan, Henderson, Farabow, Garrett & Dunner, L.L.P.

(57) ABSTRACT

A method of operating a memory device including an array of cells formed in rows and columns that comprises providing a control signal, activating the control signal, the activated control signal including a first state and a second state, continuously performing access cycles in response to the first state of the activated control signal in one part of a period, and continuously performing refresh cycles in response to the second state of the activated control signal in another part of the period.

24 Claims, 8 Drawing Sheets

REFRESH METHODS FOR RAM CELLS FEATURING HIGH SPEED ACCESS

DESCRIPTION OF THE INVENTION

1. Field of the Invention

This invention pertains in general to a memory device and more particularly, to a system and method for operating a memory device.

2. Background of the Invention

Random access memory ("RAM") devices are typically used as storage devices in various applications such as computer systems, mobile phones, and video systems. A RAM device may include a dynamic RAM ("DRAM") and a static RAM ("SRAM"). A DRAM cell generally includes a capacitor and a transistor, and therefore is advantageously small in area. Data are stored in the capacitor of a DRAM cell in the form of electric charges. The charges stored in the capacitor might be lost over time and therefore need to be restored periodically by refresh operations. A refresh operation is a process of recharging the cells in a memory chip. Cells are refreshed, for example, one row per refresh cycle.

An SRAM cell generally includes a flip-flop circuit. As compared to a DRAM cell, an SRAM cell has fast access time with no refresh operation required. However, an SRAM cell, which may include six transistors, is relatively large in size and consumes more power than a DRAM cell per bit.

A pseudo-SRAM cell is known in the art for its combined advantages of a DRAM and SRAM cells. Although a capacitor is used to store data in a cell, a refresh operation is "hidden" or "concealed" in the pseudo-SRAM cell. Examples of pseudo-SRAM cells include U.S. Pat. No. 4,549,284 to Ikuzaki, entitled "Dynamic MOS Random Access Memory," U.S. Pat. No. 6,028,804 to Leung, entitled "Method and Apparatus for 1-T SRAM Compatible Memory," and U.S. Pat. No. 6,625,077 to Chen, entitled "Asynchronous Hidden Refresh of Semiconductor Memory."

There is a general need in the art to have a pseudo-SRAM cell to include the advantages of scheduled refresh and access cycles and reduced access cycle time.

SUMMARY OF THE INVENTION

Accordingly, the present invention is directed to a system and a method that obviate one or more of the problems due to limitations and disadvantages of the related art.

To achieve these and other advantages, and in accordance with the purpose of the invention as embodied and broadly described, there is provided a memory system that comprises a memory device further comprising an array of cells formed in rows and columns, a control signal controlling operation modes of the memory device, and a generator receiving the control signal providing a refresh request at a same period if the control signal is deactivated, providing no refresh request in response to a first state of the control signal if the control signal is activated, and providing a refresh request in response to a second state of the control signal if the control signal is activated.

Also in accordance with the present invention, there is provided a method of operating a memory device including an array of cells formed in rows and columns that comprises providing a control signal, activating the control signal, the activated control signal including a first state and a second state, continuously performing access cycles in response to the first state of the activated control signal in one part of a period, and continuously performing refresh cycles in response to the second state of the activated control signal in another part of the period.

Further in accordance with the present invention, there is provided a method of operating a memory device including an array of cells formed in rows and columns that comprises providing a control signal including a first state and a second state, determining a period within which each of the cells is refreshed before data stored therein are lost, determining the number of refresh cycles to perform in the period, performing at least one refresh cycle in response to the second state of the control signal, and allowing at least one access cycle to perform in response to the first state of the control signal.

Still in accordance with the present invention, there is provided a method of operating a memory device including an array of cells formed in rows and columns that comprises providing a control signal, deactivating the control signal by connecting the control signal to a fixed level, providing a refresh request at a same period, activating the control signal, providing no refresh request in response to a first state of the activated control signal, and providing at least one refresh request in response to a second state of the activated control signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE EMBODIMENTS

Reference will now be made in detail to the present embodiment of the invention, an example of which is illustrated in the accompanying drawings. Wherever possible, the same reference numbers will be used throughout the drawings to refer to the same or like parts.

Figure 1A:
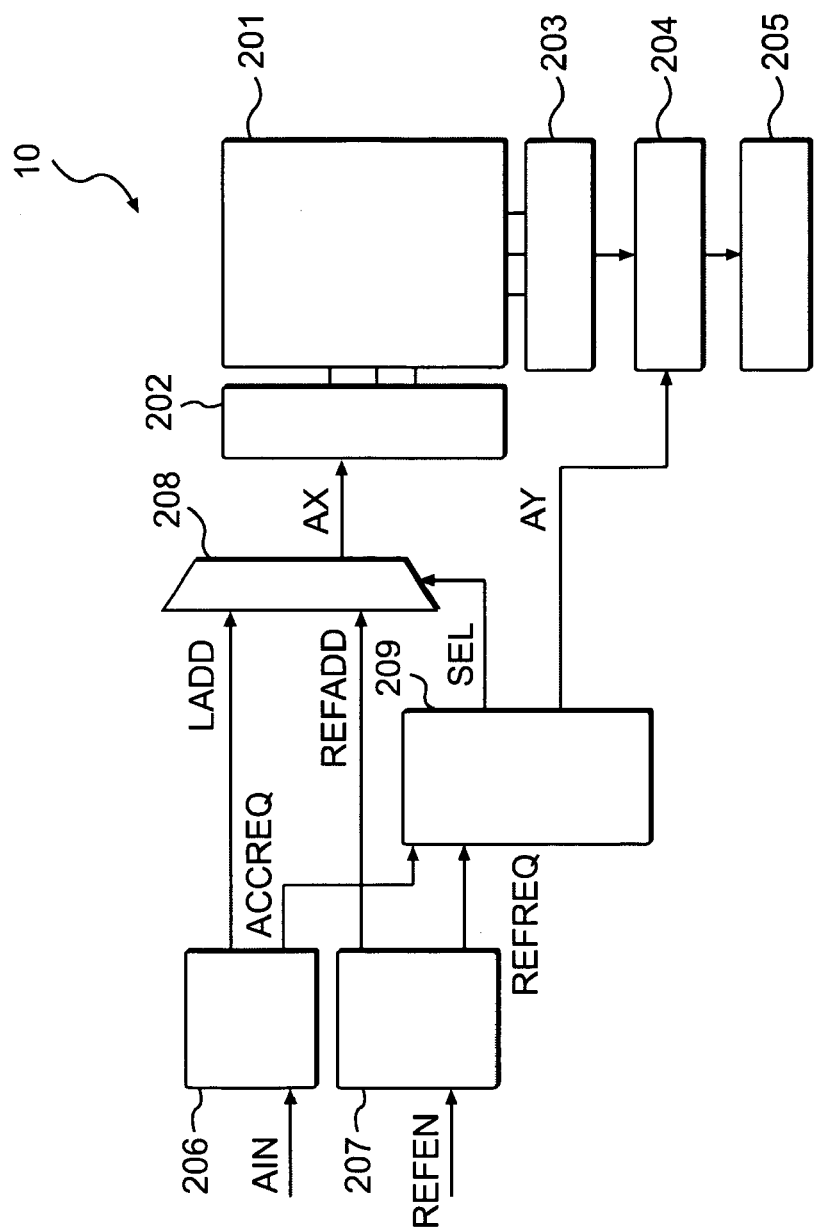
FIG. 1A is a block diagram of a memory system in accordance with one embodiment of the present invention.

FIG. 1A is a block diagram of a memory system 10 in accordance with one embodiment of the present invention. Memory system 10 includes an array of memory cells 201, a row decoder 202, an amplifier unit 203, a column decoder 204, an address buffer 206, and a refresh generator 207. Memory system 10 further includes a control signal REFEN used to control operation modes of memory system 10, which will be discussed below. In one embodiment according to the invention, control signal REFEN is externally controllable by a user. Memory cells 201, amplifier unit 203 and column decoder 204 are further illustrated in FIG. 1B. Refresh generator 207 is further illustrated in FIG. 1C.

Figure 1B:
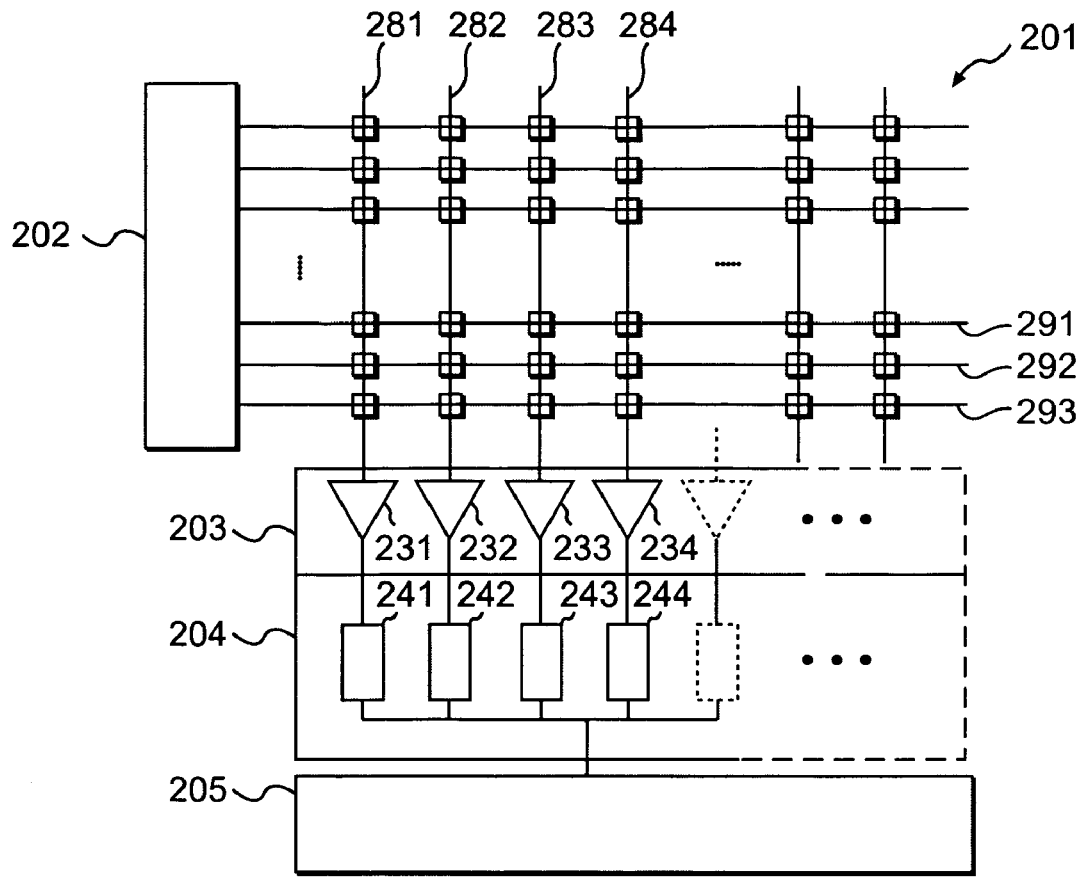
FIG. 1B is a diagram of an array of memory cells shown in FIG. 1A.

Referring to FIG. 1B, memory cells 201 are formed in rows and columns in a matrix. For discussion, only rows 291, 292 and 293, and columns 281, 282, 283 and 284 are numbered. Amplifier unit 203 includes a plurality of sense amplifiers 231, 232, 233, 234, . . . corresponding to column lines 281, 282, 283, 284, . . . respectively. Each of the sense amplifiers senses a signal level on a corresponding column line and amplifies the signal level. Column decoder 204 includes a plurality of pass gates 241, 242, 243, 244, . . . corresponding to sense amplifiers 231, 232, 233, 234, . . . , respectively. Column decoder 204 is connected to a data input/output buffer 205 through which data are read out or written in.

Figure 1C:
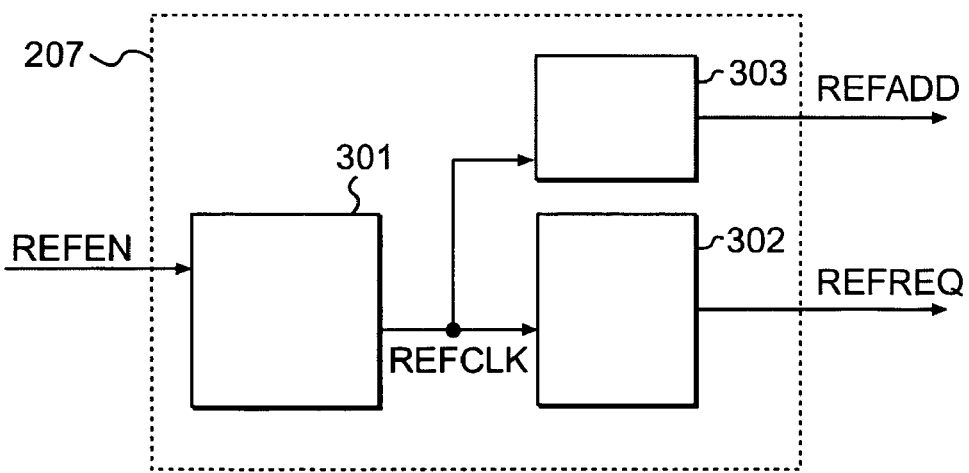
FIG. 1C is a diagram of a refresh generator shown in FIG. 1A.

Referring to FIG. 1C, refresh generator 207 further includes an oscillator 301, a refresh controller 302, and a refresh address generator 303. Oscillator 301 receives control signal REFEN, and provides a refresh clock REFCLK to refresh controller 302 and refresh address generator 303. In one embodiment according to the invention, control signal REFEN is deactivated, for example, by being connected to a fixed voltage level. In response to a deactivated control signal REFEN, oscillator 301 provides refresh clock REFCLK at a plurality of sub-periods tRP within a period tREFmax. The period tREFmax refers to a maximum time interval within which each particular cell 201 should be refreshed before data stored therein are lost. A sub-period tRP refers to one within which a refresh operation or a refresh cycle should be performed. Each of sub-periods tRP is equal to tREFmax divided by N, where N is the number of total refresh cycles performed for the array of cells 201 within the interval tREFmax. Oscillator 301 may include a timer (not shown) for periodically generating refresh clock REFCLK at sub-periods tRP. In one embodiment according to the invention, a total number of 4096 refresh cycles are performed within 64 ms (milliseconds). For an 8 Mb memory device having 512K rows, a refresh operation is performed approximately every 10 μs (microseconds) to 15 μs.

In another embodiment according to the invention, control signal REFEN is activated, which includes a first state and a second state. The first state may include a logic low state, and the second state may include a logic high state. In response to the first state of an activated control signal REFEN, oscillator 301 and refresh generator 207 are turned off. In response to the second state of an activated control signal REFEN, oscillator 301 is turned on and provides a refresh clock REFCLK at a plurality of sub-periods tRP1, tRP2 . . . and tRPN within tREFmax. Each of sub-periods tRP1, tRP2 . . . and tRPN may be different from tRP.

Figure 1D:
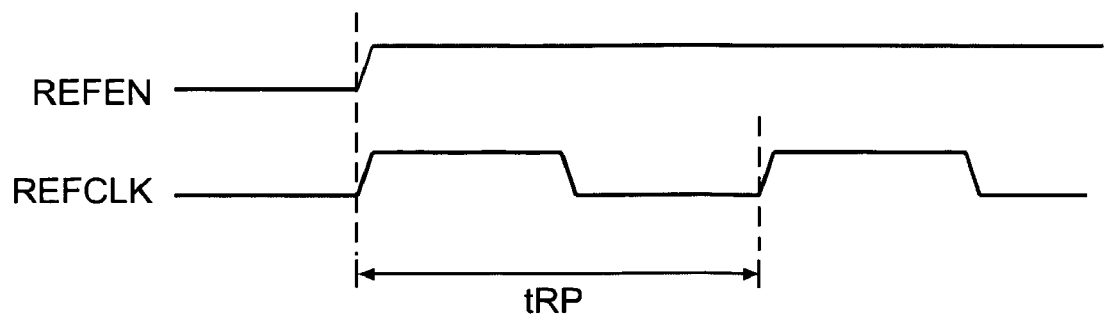
FIGS. 1D, 1E and 1F are timing diagrams of a control signal and a refresh clock in accordance with one embodiment of the present invention.
Figure 1E:
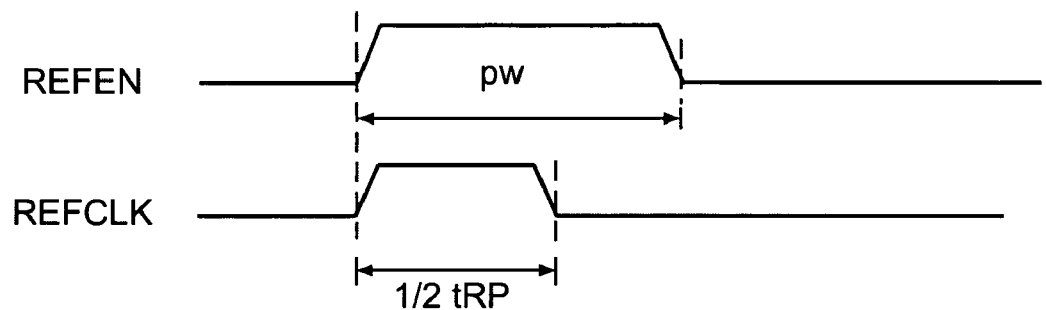
Figure 1F:
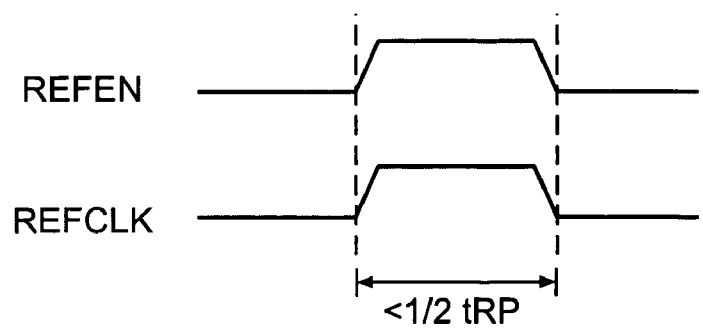

FIGS. 1D, 1E and 1F are timing diagrams of control signal REFEN and refresh clock REFCLK. Referring to FIG. 1D, when control signal REFEN is deactivated, refresh clock REFCLK is generated periodically every tRP. Referring to FIG. 1E, when control signal REFEN is activated, refresh clock REFCLK is generated in response to a high logic state of control signal REFEN. Referring to FIG. 1F, refresh clock REFCLK rises and falls with control signal REFEN if a pulse width PW of control signal REFEN is smaller than half a tRP, which allows more than one refresh clock REFCLK to be provided and in turn more than one refresh cycle to perform within tRP.

Referring again to FIG. 1A, address buffer 206 receives an input address signal AIN during an access operation, and provides a latched address signal LADD to a multiplexer 208 when input address signal AIN is latched. Address buffer 206 also provides an access request ACCREQ to a signal controller 209 for an access operation for a row of cells 201 corresponding to latched address signal LADD. Refresh generator 207 receives control signal REFEN, and provides a refresh address signal REFADD to multiplexer 208 and a refresh request REFREQ to signal controller 209 for a refresh operation for a row of cells 201 corresponding to refresh address signal REFADD. Signal controller 209 may include an arbiter circuit (not shown) to determine the priority of access request ACCREQ and refresh request REFREQ, and provides a selection signal SEL to multiplexer 208. Signal controller 209 also provides a column address AY to column decoder 204. Meanwhile, in response to signals LADD, REFADD and SEL, multiplexer 208 provides a row address AX to row decoder 202. An access or a refresh operation, depending on selection signal SEL, is then performed for one of cells 201 corresponding to the row address AX and column address AY.

Figure 2A:
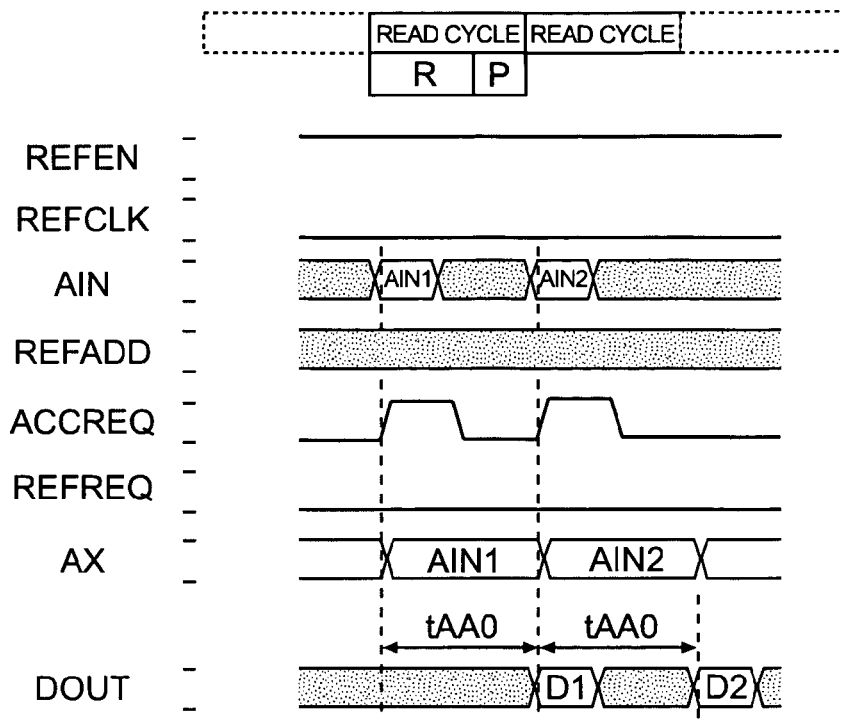
FIG. 2A is a diagram showing an access operation in accordance with one embodiment of the present invention.

FIG. 2A is a diagram showing an access operation in accordance with one embodiment of the present invention. When control signal REFEN is deactivated, access cycles are allowed to perform until a refresh request is made. Referring to FIG. 2A, an access request ACCREQ is pulled high whenever an access address signal AIN is asserted. Row decoder 202 and column decoder 204 respectively selects a corresponding row and column of a memory array. In the particular embodiment shown in FIG. 2A, only read cycles are illustrated. However, skilled persons in the art will understand that an access cycle may include one of a read cycle or a write cycle. A read cycle, performed for an access time of tAA0, includes a first period R and a second period P. The first period R covers the time for selecting a corresponding row and sensing data stored in the row of cells. The second period P covers the time for switching pass gates and sending selected data for output. For an 8 Mb memory device with a bandwidth of 16, the read access time tAA0 is approximately 20 ns (nanoseconds) to 80 ns.

Figure 2B:
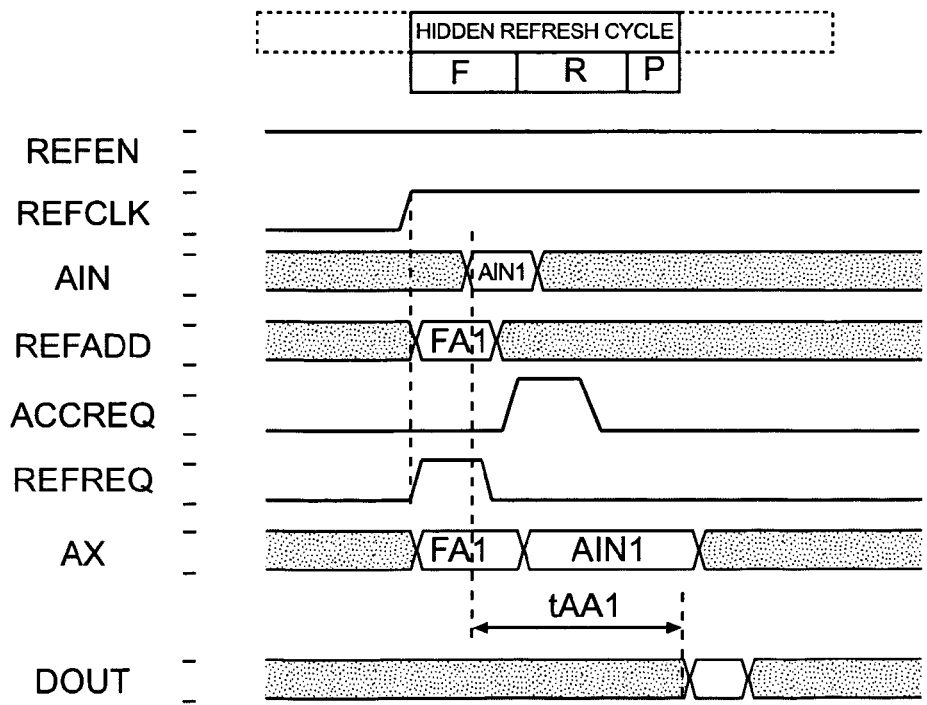
FIG. 2B is a diagram showing a refresh operation in accordance with one embodiment of the present invention.

FIG. 2B is a diagram showing a refresh operation in accordance with one embodiment of the present invention. When control signal REFEN is deactivated and a refresh cycle occurs in response to a refresh clock REFCLK periodically generated at tRP, a refresh operation is performed. The refresh operation is "hidden" from a user because it is automatically performed. Since a periodic refresh operation may occur before or after a pending access operation, a refresh request REFREQ regarding the refresh operation and an access request ACCREQ regarding the access operation are compared to each other in signal controller 209 to determine which operation to perform first. A resultant access time including a refresh operation, performed for a time of tAA1 greater than tAA0, includes a third period F in addition to the first period R and the second period P. The third period F covers the time for selecting a corresponding row and restoring data in the row, and has a same time length as the first period R. Time tAA1 is measured from a time an address access signal AIN is asserted to a time selected data are output. Therefore, the length of tAA1 is directly dependent on the time access address signal AIN is asserted. That is, the earlier AIN is asserted, the greater length tAA1 has.

Figure 3A:
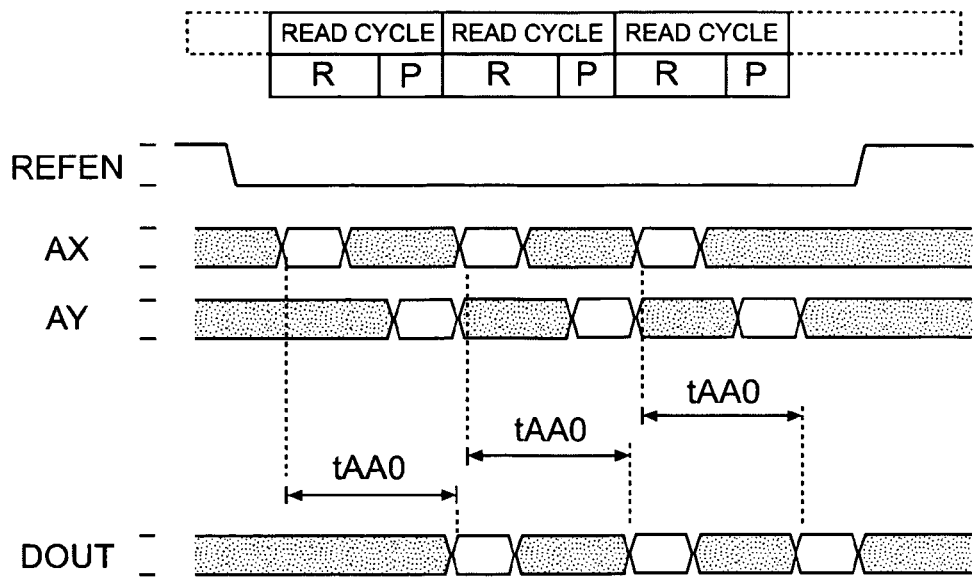
FIG. 3A is a diagram showing an access operation in accordance with another embodiment of the present invention.

FIG. 3A is a diagram showing an access operation in accordance with another embodiment of the present invention. Control signal REFEN, when activated, includes a first state and a second state. In response to the first state of an activated control signal REFEN, oscillator 301 is turned off and therefore no refresh request is made. Access cycles are allowed to perform until a refresh request is made. Referring to FIG. 3A, access cycles are continuously performed without being interrupted or compromised by periodic refresh cycles, resulting in a reduction of total access time. Each of the access cycles includes a first period R and a second period P and is performed for an access time of tAA0.

Figure 3B:
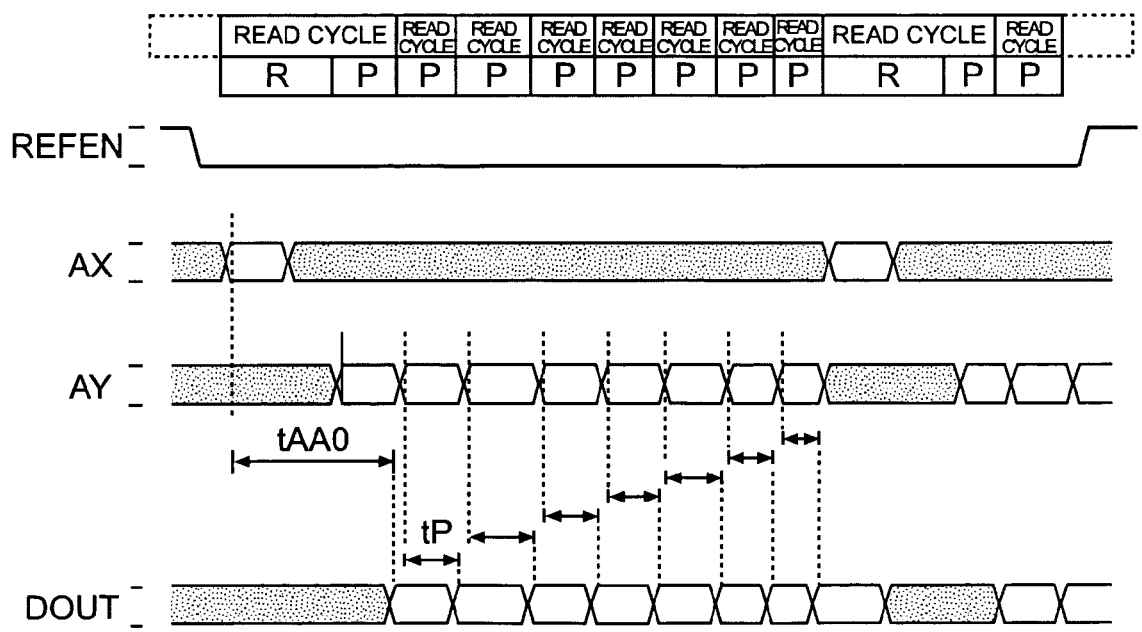
FIG. 3B a diagram showing an access operation in accordance with still another embodiment of the present invention.

FIG. 3B is a diagram showing an access operation in accordance with still another embodiment of the present invention. Control signal REFEN is activated and held at the first state. A plurality of access cycles are continuously performed without interruption of refresh cycles. In a first period R of a first access cycle, a row address signal AX is asserted to select a row of cells 201, and data stored in the row of cells 201 are sensed by the sense amplifiers. In a second period P of the first access cycle following the first period R, a column address signal AY is asserted to switch pass gates, and selected data are sent for output. The access time for the first access cycle is TAA0. For the remaining access cycles, the same row of cells 201 is kept for data access. As a result, only the second period P is spent for each of the remaining access cycles. The access time for each of the remaining cycles is tP. Since no new row is selected in the access cycles, a time-consuming row changing is eliminated, resulting in a further reduction of total access time.

Figure 4:
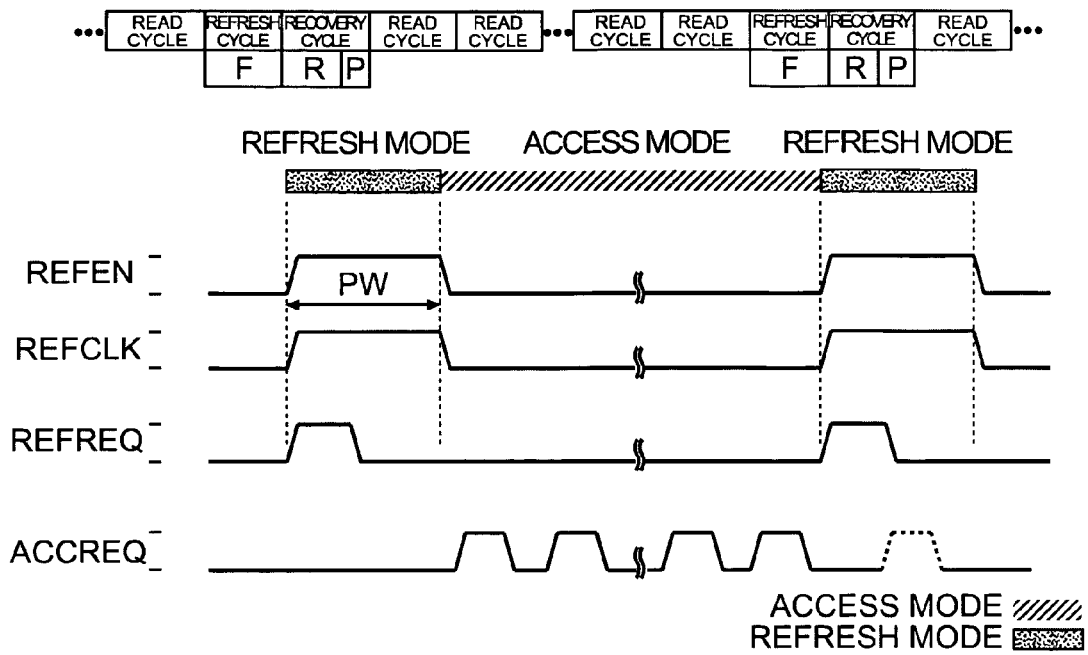
FIG. 4 is a diagram showing a method of operating a memory device in accordance with one embodiment of the present invention.

FIG. 4 is a diagram showing a method of operating a memory device in accordance with one embodiment of the present invention. The method uses a control signal REFEN to control operation modes of a memory device. When control signal REFEN is activated, the memory device is operated in a first mode or access mode in response to a first state of the activated control signal REFEN. In the first mode, access cycles are continuously performed without interruption of refresh cycles, which has been discussed in conjunction with FIGS. 3A and 3B. The memory device is operated in a second mode or refresh mode in response to a second state of the activated control signal, which will be discussed in conjunction with FIGS. 5A to 5C. An activated control signal REFEN has a pulse width PW smaller than half a tRP, and therefore allows continuous access cycles or continuous refresh cycles to perform. When control signal is deactivated, for example, by being connected to a fixed voltage level, the memory device is operated in a mode in which a refresh cycle is periodically generated at each of sub-periods tRP, which has been discussed in conjunction with FIGS. 2A and 2B.

Figure 5A:
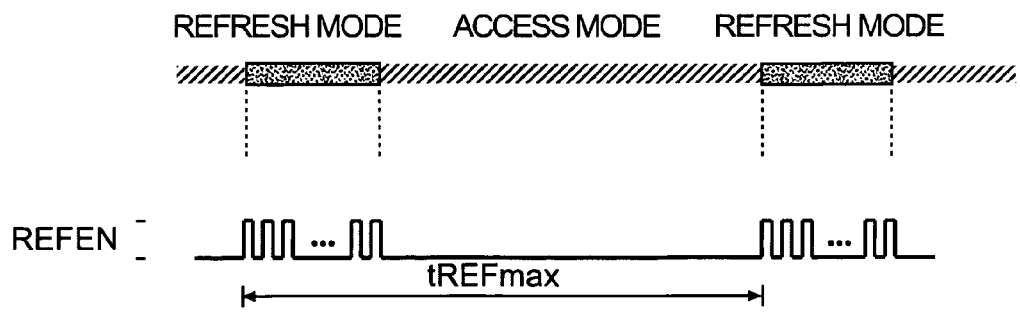
FIG. 5A is a diagram showing a method of operating a memory device in accordance with one embodiment of the present invention.

FIG. 5A is a diagram showing a method of operating a memory device in accordance with one embodiment of the present invention. Refresh cycles are continuously performed in one part of tREFmax in a refresh mode without interruption of access cycles, and access cycles are continuously performed in the other part of tREFmax.

Figure 5B:
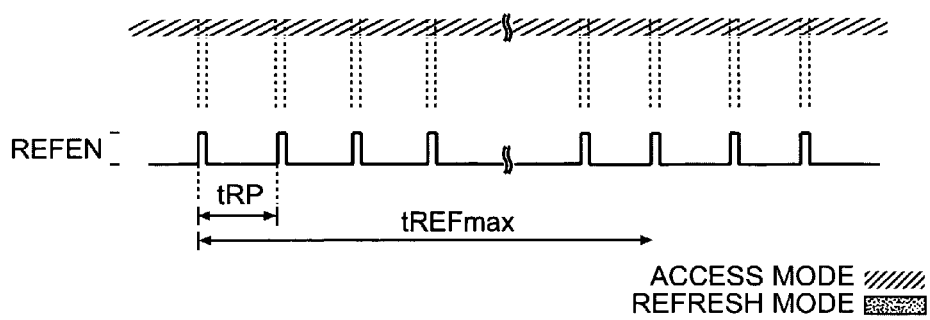
FIG. 5B is a diagram showing a method of operating a memory device in accordance with another embodiment of the present invention.

FIG. 5B is a diagram showing a method of operating a memory device in accordance with another embodiment of the present invention. A refresh cycle is performed when tREFmax or one of sub-periods tRP occurs. Access cycles are allowed to perform between two consecutive refresh cycles until tREFmax or tRP occurs.

Figure 5C:
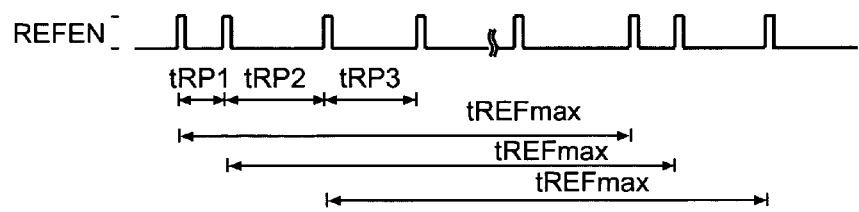
FIG. 5C is a diagram showing a method of operating a memory device in accordance with still another embodiment of the present invention.

FIG. 5C is a diagram showing a method of operating a memory device in accordance with still another embodiment of the present invention. Refresh cycles are performed at sub-periods tRP1, tRP2 . . . tRPN within tREFmax. Each of sub-periods tRP1, tRP2 . . . tRPN may be different from tRP.

Figure 6:
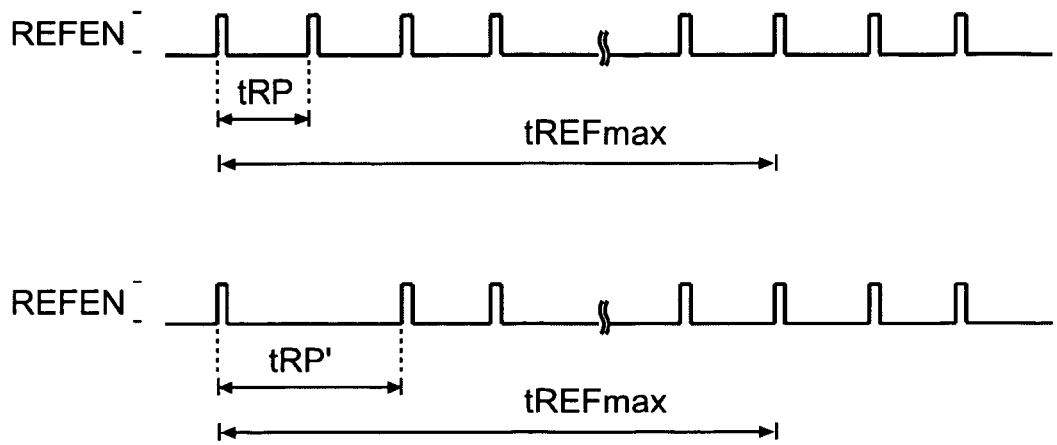
FIG. 6 is a diagram showing a method of operating a memory device in accordance with one embodiment of the present invention.

FIG. 6 is a diagram showing a method of operating a memory device in accordance with one embodiment of the present invention. By changing the number of total refresh cycles N, the refresh period is changed. In the upper part of FIG. 6, a refresh cycle of N refresh cycles is performed at every tRP. In the lower part of FIG. 6, a refresh cycle of N/2 refresh cycles is performed at every tRP', two times tRP.

Figure 7:
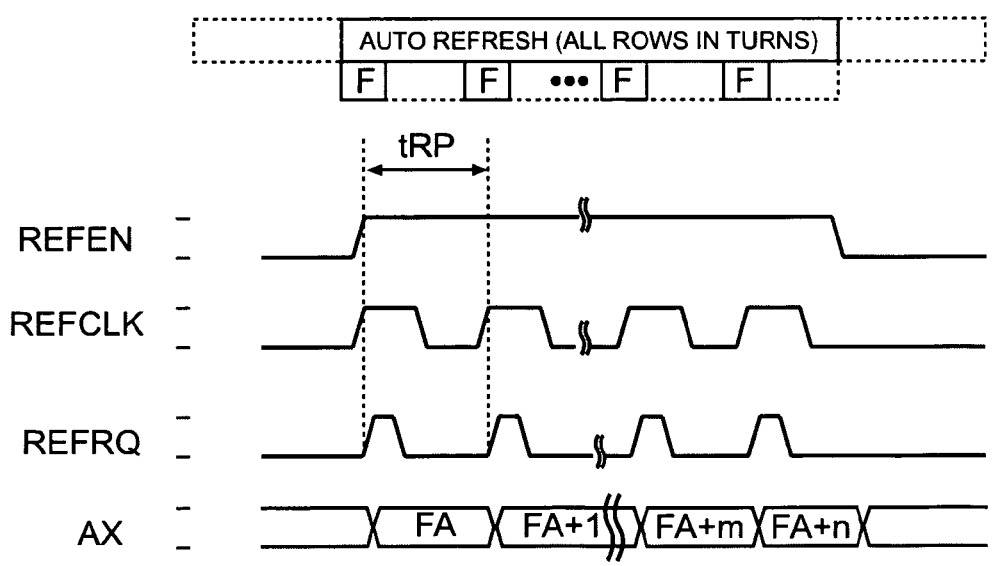
FIG. 7 is a diagram showing a method of operating a memory device in accordance with yet another embodiment of the present invention.

FIG. 7 is a diagram showing a method of operating a memory device in accordance with yet another embodiment of the present invention. By maintaining control signal REFEN at the second state, an "auto-refresh" is performed within tREFmax for the entire array of cells by refreshing all rows in turn.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory system comprising:
   a memory device comprising an array of cells formed in rows and columns; and
   a generator receiving a control signal controlling operation modes of the memory device, the generator providing a refresh request at equal periodic intervals if the control signal is deactivated, providing no refresh request in response to a first state of the control signal if the control signal is activated, and providing a refresh request in response to a second state of the control signal if the control signal is activated.

2. The system of claim 1, wherein the generator provides the refresh request at equal periodic intervals in response to the second state of the control signal if the control signal is activated.

3. The system of claim 1, wherein the generator provides the refresh request at different periodic intervals in response to the second state of the control signal if the control signal is activated.

4. The system of claim 2, wherein the control signal further comprises a pulse width smaller than half of the equal period intervals.

5. The system of claim 1, the generator further comprising a clock generator generating a clock signal at equal period intervals if the control signal is deactivated.

6. The system of claim 1 wherein the control signal is connected to a fixed voltage level when deactivated.

7. The system of claim 1 further comprising:
a column decoder including a plurality of pass gates; and
an amplifier unit disposed between the memory device and the column decoder further comprising a plurality of sense amplifiers corresponding to the pass gates.

8. The system of claim 1, the memory device being operated in continuous access cycles in response to the first state of the control signal.

9. The system of claim 1, the memory device being operated in continuous refresh cycles in response to the second state of the control signal.

10. A method of operating a memory device including an array of cells formed in rows and columns comprising:
providing a control signal;
activating the control signal, the activated control signal including a first state and a second state;
continuously performing access cycles in response to the first state of the activated control signal in one part of a period; and
continuously performing refresh cycles in response to the second state of the activated control signal in another part of the period.

11. The method of claim 10 further comprising providing the period within which each of the cells is refreshed before data stored therein are lost.

12. The method of claim 10 further comprising allocating to each of the access cycles a first access time for selecting and sensing a row of cells and a second access time for data output in continuously performing the access cycles.

13. The method of claim 10 further comprising allocating to a first of the access cycles a first access time for selecting and sensing a row of cells and a second access time for data output, and allocating to each of the remaining access cycles the second access time.

14. The method of claim 10 further comprising:
deactivating the control signal; and
generating a refresh clock signal at a same period.

15. The method of claim 10 further comprising providing the control signal with a pulse width smaller than half the period divided by the number of total refresh cycles performed.

16. A method of operating a memory device including an array of cells formed in rows and columns comprising:
providing a control signal including a first state and a second state;
determining a period within which each of the cells is refreshed before data stored therein are lost;
determining the number of refresh cycles to perform in the period;
performing at least one refresh cycle in response to the second state of the control signal; and
allowing at least one access cycle to perform in response to the first state of the control signal.

17. The method of claim 16 further comprising continuously performing access cycles in one part of the period, and performing refresh cycles in another part of the period.

18. The method of claim 16 further comprising performing a refresh cycle at each of a plurality of sub-periods in the period.

19. The method of claim 18 further comprising performing a refresh cycle at each of the sub-periods of a same time length.

20. The method of claim 18 further comprising performing a refresh cycle at each of the sub-periods of different time lengths.

21. A method of operating a memory device including an array of cells formed in rows and columns comprising:
providing a control signal;
deactivating the control signal by connecting the control signal to a fixed level;
providing a refresh request at equal periodic intervals;
activating the control signal;
providing no refresh request in response to a first state of the activated control signal; and
providing at least one refresh request in response to a second state of the activated control signal.

22. The method of claim 21 further comprising:
determining a period within which each of the cells is refreshed before data stored therein are lost; and
determining the number of refresh cycles to perform in the period.

23. The method of claim 22 further comprising determining the equal periodic intervals by dividing the period by the number of refresh cycles to perform in the period.

24. The method of claim 21 further comprising:
maintaining the control signal at the second state; and
continuously performing refresh cycles in the period.

* * * * *